United States Patent
Mizuno et al.

(10) Patent No.: US 6,663,714 B2
(45) Date of Patent: Dec. 16, 2003

(54) CVD APPARATUS

(75) Inventors: Shigeru Mizuno, Tokyo (JP); Hiroshi Doi, Tokyo (JP); Seiji Itani, Tokyo (JP); Xiao-Meng Liu, Tokyo (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/858,239

(22) Filed: May 17, 2001

(65) Prior Publication Data

US 2001/0042514 A1 Nov. 22, 2001

(30) Foreign Application Priority Data

May 17, 2000 (JP) ........................ 2000-145631

(51) Int. Cl.⁷ ..................... H01L 21/00; C23C 16/00
(52) U.S. Cl. ................ 118/719; 118/715; 118/725; 118/728; 156/915
(58) Field of Search ................. 118/719, 715–733; 156/345.1

(56) References Cited

U.S. PATENT DOCUMENTS

| 5,000,113 A | 3/1991 | Wang et al. |
| 5,094,885 A | 3/1992 | Selbrede |
| 5,133,284 A | 7/1992 | Thomas et al. |
| 5,238,499 A | 8/1993 | van de Ven et al. |
| 5,855,687 A | * 1/1999 | DuBois et al. ............ 118/500 |
| 5,882,419 A | * 3/1999 | Sinha et al. ............. 118/500 |
| 6,096,135 A | * 8/2000 | Guo et al. ............... 118/729 |

FOREIGN PATENT DOCUMENTS

| JP | 4-233221 | 8/1992 |
| JP | 5-38904 | 2/1993 |
| JP | 6-13368 | 1/1994 |
| JP | 6-208959 | 7/1994 |
| JP | 6-295872 | 10/1994 |
| JP | 7-221024 | 8/1995 |
| JP | 8-222556 | 8/1996 |
| JP | 8-233221 | 9/1996 |
| JP | 2603909 | 1/1997 |
| JP | 10-41251 | 2/1998 |
| JP | 10-41253 | 2/1998 |
| JP | 10321524 A | * 12/1998 | ......... H01L/21/205 |
| JP | 11-36076 | 2/1999 |

OTHER PUBLICATIONS

"Effects of Copper Contamination in Silicon on Thin Oxide Breakdown," Journal of The Electrochemical Society, 146 (6), pp. 2258–2260 (1999).

"Deposition Rate and Gap Filling Characteristics in Cu Chemical Vapor Deposition With Trimethylvinylsilyl Hexafluoro–Acetylacetonate Copper(I)," Publication Board, Japanese Journal of Applied Physics, Part 1, No. 12A, pp. 6358–6363 (1998).

* cited by examiner

Primary Examiner—Gregory Mills
Assistant Examiner—Ram N Kackar
(74) Attorney, Agent, or Firm—Burns, Doane, Swecker, Mathis, LLP

(57) ABSTRACT

The present invention is to provide a CVD apparatus having a high productivity, involving less contamination on the back surface of a substrate and having a high yield.

A CVD apparatus for forming a thin film is characterized in that the interior of the vessel is divided into a upper portion and a lower portion (transfer chamber) by a support member for holding the ring chuck and the upper portion is further divide by inner wall into a deposition chamber and an exhaust chamber in axial symmetry around the same central axis.

The deposition chamber communicated to the exhaust chamber through a gap between the inner wall and the ring chuck and/or holes provided in the inner wall. The transfer chamber is communicated to the deposition chamber or exhaust chamber through a gap formed between the ring chuck and the support member.

44 Claims, 6 Drawing Sheets

(a)

(b)

(a)

(b)

CVD APPARATUS

BACKGROUND OF THE INVENTION

1. Field of the Invention

The present invention relates to a CVD apparatus, and more particularly, to a CVD apparatus intended for forming a Cu thin film, used as a wiring material or the like in semiconductor integrated circuits.

2. Prior Art

In recent years, as there is a tendency for semiconductor devices to be highly integrated, dimensions such as wiring width, wiring spacing and the like in metallic wiring for formation of integrated circuits tend to decrease. Such reduction in wiring dimensions leads to an increase in wiring resistance and also narrowing of wiring spacing leads to an increase in parasitic capacitance between wirings, which causes a problem that time delay of electric signals in integrated circuits increases. In this case, a measure to increase a wiring height to increase a cross sectional area of wiring is taken in order to suppress an increase in wiring resistance but a wiring height cannot be increased excessively because the increase in areas of facing surfaces of wirings leads to the increase in parasitic capacitance. Such problem in time delay of signals has become serious to the extent that the normal operations of integrated circuits are impeded in wiring dimensions of around 0.1 micron.

Also, an increase in resistance and electric current density, due to a reduced wiring width, will cause wiring temperature rise due to Joule heat and electromigration to degrade reliability in integrated circuits.

Hereupon, in order to solve the problems in time delay of signals and degradation of reliability, Cu having a lower resistance and a higher fusing point than those of Al has recently been used as a material for metallic wiring.

Meanwhile, while a three-dimensional wiring construction using a multi-layered wiring is made in semiconductor integrated circuits, the reduction in wiring dimensions involves a tendency for via holes, by which the connection of three-dimensional wiring is made, to become minute. Embedding of Cu by means of electrolytic plating has been made as a method of embedding a metallic material in such minute via holes.

Plating requires a Cu thin film (seed Cu layer), which is formed by means of the sputtering method.

However, there is a problem that when wiring dimensions come to a level of 0.1 micron to lead to an increase in aspect ratio (ratio of hole depth to opening diameter), the seed layer with adequate thickness is not formed on hole walls due to the poor step covering performance of the sputtering method, thus resulting in failure in plating.

With a further increase in the aspect ratio, the failure is caused in embedding in the holes even with the electrolytic plating. The Cu embedding technique by the CVD method (chemical vapor deposition method) has been given attention and investigated in order to solve the problem of embedding of metallic wiring in such minute holes and to afford the formation of even seed layer and complete embedding in interiors of minute holes having an opening diameter of 0.1 micron or less.

With respect to Cu embedding by the CVD method, a study report has been presented to indicate the possibility of complete embedding in minute holes with an aspect ratio of 7 at adequate deposition rate, as described, for example, in Jpn. J. Appl. Phys. Vol. 37 (1998) pp. 6358–6363, and thus the CVD method has been recognized as a promising Cu embedding technique.

As has been described above, techniques with respect to the Cu wiring and embedding are exceedingly important in semiconductor integrated circuits, which will be further promoted in high integration and high performance in the future, and the importance of the CVD method and apparatus intended for formation of Cu thin films is increasingly enhanced in the semiconductor mass-production process.

It is believed that such development of Cu-CVD apparatus in the semiconductor mass-production process is attainable by application of conventional metal CVD apparatuses. Hereupon, examinations have been tried, in which a gas introduction mechanism of the tungsten CVD apparatus currently involving a most established technique as a metal CVD apparatus is modified to suit for a raw material used in the Cu-CVD apparatus.

The gas introduction mechanism in the tungsten CVD method is one, in which vapor of tungsten hexafluoride being a liquid material is introduced into a deposition chamber while being controlled in flow rate by an ordinary gas mass flow controller. Meanwhile, with the Cu-CVD method, organic liquid materials, for example, Cu (hfac) (tmvs) are used as a raw material, but vapor pressure thereof is as low as at most 100 Pa at room temperature, so that ordinary gas mass flow controllers cannot be used. Hereupon, as described, for example, in Jpn. J. Appl. Phys. Vol. 37 (1998) pp. 6358–6363, an introduction method is used, in which a liquid material is fed to an evaporator at a predetermined flow rate with the aid of a liquid mass flow controller and is vaporized in the evaporator, and then is fed to a deposition chamber. Such a raw material gas introduction mechanism composed of the liquid mass flow controller and the evaporator is different from the gas introduction mechanism in the tungsten CVD method.

Besides this, the introduction method uses a gas introduction section for introducing a vaporized gas directly into the deposition chamber, a substrate heating mechanism and an exhaust mechanism similar to one used in the conventional tungsten CVD method.

Here, in the semiconductor manufacturing process, when a metallic thin film such as tungsten is to be formed with the CVD method, the generation of particles must be suppressed as much as possible in order to stably produce high performance integrated circuits, and so it is necessary in this point of view to prevent the deposition on the back surface of a substrate. Also, in particular, in the case of Cu thin films, the prevention of deposition on the back surface of a substrate becomes further important as compared with tungsten or the like for the following reason. That is, since Cu diffuses in Si at a high rate and greatly affects the performance of Si semiconductors, and the diffusion rate is increased as a substrate temperature rises, the prevention of film adhesion and of spreading of a raw material to the back surface of a substrate during deposition becomes particularly important in the case where the deposition is made at high temperatures (J. Electrochem. Soc., 2258–2260 (1999)).

Several measures, which have been established for preventing the deposition on and adhesion of a raw material gas to the back surface of a substrate in the tungsten CVD method, maybe applied to the Cu-CVD method. Here, mechanisms for preventing a raw material gas from spreading to the back surface of a substrate in conventional tungsten CVD apparatuses will be summarized.

FIG. 5 shows, as a first example, a CVD apparatus disclosed in Japanese Patent Laid-Open No. 7-221024. A raw material gas introduction section 35 and a substrate holder 33 opposed to the section for placing thereon a substrate are arranged in a reduced pressure vessel 31, and a gas emitted from the raw material gas introduction section 35 is decomposed to form a thin film on the substrate 32. Here, the holder 33 is moved up and down by a lift 41, and rises at the time of deposition to lift a ring chuck 34 to bring a surface of the substrate 32 into entirely circumferential contact with a lower, horizontal surface of a tip end 40 of the ring chuck 34, thereby preventing a raw material gas from spreading to the back surface of the substrate. Also, at the time of substrate exchange, the holder 33 descends and the ring chuck 34 is supported by a support member 36.

An unreacted raw material gas and a secondary product gas flow into a chamber 71 from a chamber 70 through an opening 39 formed in the support member 36, and are exhausted outside a vessel via an exhaust port 38. Also, a purge gas introduction pipe 42 is provided in a chamber 72 for preventing the raw material gas and the secondary product gas from flowing toward the chamber 72, and a purge gas having been introduced into the chamber 72 flows into the chamber 70 through a gap between the ring chuck 34 and the support member 36 to be exhausted outside the vessel together with the raw material gas and the like.

The prevention mechanism for raw material gas spreading shown in FIG. 5 is designed to have the ring chuck and a substrate contacting with each other over the entire outer circumference portion of the substrate to prevent the raw material gas spreading, so that a distance of contact portions between the ring chuck and the substrate is significant. Also, with this method, the film deposition will occur at the contact portion from the substrate surface to a tip end of the ring chuck.

Similar constructions are also disclosed in Japanese Patent Laid-Open No. 5-38904, U.S. Pat. Nos. 5,000,113 and 5,094,885.

Also, Japan Patent No. 2603909 discloses, as shown in FIG. 6, a mechanism, in which pins 43 mounted on a lower surface and 1.0 to 1.5 mm from the inner circumference of a vertically moving ring chuck 34 are used to fix a substrate 32 to a holder 33, and a purge gas is blown off to the gap between the ring chuck and the substrate to prevent a raw material gas from spreading to the back surface of the substrate. In this method, in terms of the prevention of the raw material gas spreading, a flow rate of purge gas, a spacing A between the ring chuck and the substrate, determined by the height of the pins, and a distance B, over which the ring chuck covers the substrate, are important. In addition, since the pins are disposed on the outer side of the inner circumference of the ring chuck, the film deposition will not be made on the contact portions where the pins and the substrate contact with each other.

Further, Japanese Patent Laid-Open No. 4-233221 discloses, as shown in FIG. 6, a mechanism, in which a vacuum chuck is used to fix a substrate 32 on a holder 33 and a purge gas from a gas groove 45 is blown to the vicinity of an outer circumference portion of the substrate to prevent a raw material gas from spreading to the back surface of the substrate. In this case, the flow rate of the purge gas is important in preventing spreading of a raw material gas. The space between a chuck groove 44 on the holder 33 and the substrate 32 is exhausted with the use of a separate exhaust system from one for a deposition chamber to provide a pressure difference between the chuck groove 44 and the deposition chamber, thereby fixing the substrate 32.

This method has an advantage that the deposition can be made on the entire surface of the substrate and therefor the chip yield is enhanced to lead to an increase in productivity of semiconductor devices.

PROBLEMS TO BE SOLVED BY THE INVENTION

However, the CVD apparatus shown in FIG. 5 (Japanese Patent Laid-Open No. 7-221024 involves a problem that particles of Cu are generated due to film peeling-off at the contact portion when the ring chuck is detached from the substrate because the film is formed also on the contact portion of the substrate 32 and the ring chuck 34. When the particles of Cu fall on the holder, they will adhere to a substrate to be subsequently processed to cause Cu contamination.

Also, in order to securely prevent the spreading of a raw material gas, it is necessary to increase a width, over which the ring chuck covers the outer circumference portion of the substrate, and therefore there is caused a problem that the deposition area on the substrate cannot but be reduced.

Further, in the course of examining apparatuses and arrangements being more highly effective in prevention of spreading of a raw material gas, the present inventors have found that the CVD apparatus shown in FIG. 5 involves a significant problem. That is, while there is the need of providing a substrate transfer mechanism in the case of manufacturing apparatuses, it has been found that even if a purge gas is made flow, the prevention effect of raw material gas spreading is greatly lowered when the substrate transfer ports for a substrate transfer arm are provided in an outer side wall and an inner side wall 37 of the chamber 71.

In variously examining the entire construction including mount positions of substrate transfer ports and the like, it has been found that the gas flowing path of a raw material gas, along which the raw material gas is exhausted outside the vessel after it has been introduced into a reduced pressure vessel, greatly affects the extent of spreading of the raw material gas and that the prevention effect of the raw material gas spreading can be enhanced by forming a gas flow in axial symmetry and without stagnation. More specifically, the reason why the provision of substrate transfer ports lowers the prevention effect of raw material gas spreading in the apparatus shown in FIG. 5 is presumably that since the opening 39 cannot be symmetrically provided around the substrate, the gas flow becomes ununiform to cause the stagnation of the raw material gas to permit the raw material gas to spread into the chamber 72, thus causing the contamination on the back surface of the substrate. Also, it is believed that even if a purge gas is introduced into the chamber 72 to flow toward the chamber 70, the above construction makes the flow of the purge gas partial and so an adequate prevention effect cannot be exhibited.

With the second example (Japan Patent No. 2603909), even if a purge gas is made flow through a gap between the substrate 32 and the ring chuck 34, a raw material gas in some cases diffuses to low concentration side against the flow of the purge gas, due to ununiformity in flow rate and the flow of the purge gas.

Besides, since a distance B, over which the ring chuck covers the substrate, is as short as 1.0 to 1.5 mm, the raw material gas may reach the holder 33 in the vicinity of the substrate, and as the number of substrates to be processed increases, the film adhesion occurs on the holder surface, which become responsible for the contamination on the back surface of the substrate.

Also, the substrate 32 is fixed by means of the pins 43, the purge gas is made flow through the gap A determined by the height of the pins, and a predetermined distance between the tip end of the ring chuck and the pins is required so as to eliminate the deposition on the pins, so that the deposition on the entire surface of the substrate is impossible like the first example.

With the third example (Japanese Patent Laid-Open No. 8-233221), the sealing between the substrate and the holder 33 is made by simple contact with the vacuum chuck and the atmospheric gas near the circumference of the substrate is sucked by the vacuum chuck, so that a raw material gas existing near the substrate penetrates into the back surface of the substrate to cause contamination on the back surface of the substrate. Also, this method involves a problem that the application to the deposition at low pressures of 1.5 kPa or less is impossible because a pressure difference between deposition pressure and pressure in the chuck groove 44 is made use of for chucking the substrate.

In this manner, measures employed in conventional tungsten CVD apparatuses, respectively, have advantages and disadvantages and so are not entitled to be adequate in terms of yield rate, chip yield and stable productivity, so that a mechanism is desired, which is excellent in preventing adhesion of a raw material gas to the back surface of a substrate. In particular, with CVD apparatuses used in formation of Cu thin films for wiring of semiconductor circuits, since integrated circuits are deteriorated in performance if even a minute amount of raw material gas adheres to the back surface of a substrate as described above, a more strict adhesion preventing mechanism has been demanded as compared with tungsten and the like. That is, it has been said that it is necessary to limit Cu contamination on the back surface of a substrate, to for example, $1 \times 10^{13}$ cm$^{-2}$ or less (J. Electrochem. Soc., 2258–2260 (1999)).

SUMMARY OF THE INVENTION

Under the circumstances described above, the present invention has its object to solve problems of prior art apparatuses and to provide a CVD apparatus having a high productivity, involving less contamination on the back surface of a substrate and having a high yield.

Further, it is an object of the invention to provide a CVD apparatus for formation of Cu thin films applicable to semiconductor integrated circuits, which will be further promoted in high integration and high performance in the future.

MEASURE FOR SOLVING THE PROBLEMS

In order to solve the problems of the prior art and attain the above-mentioned objects, the present inventors have made various, fundamental investigations on the relationship between internal constructions of a reduced pressure vessel, gas flows, substrate fixing methods or the like and the contamination on the back surface of a substrate and as a result accomplished the invention shown below.

That is, a CVD apparatus of the present invention for forming a thin film including at least one of constituent elements of a raw material gas on a substrate by placing the substrate on a heating holder provided in a reduced pressure vessel, fixing the substrate by means of a ring chuck having the function of preventing the raw material gas and a secondary product gas from spreading to the back surface of the substrate, and introducing the raw material gas from a gas introducing section provided to be opposed to the substrate, is characterized by a support member provided on side walls of the reduced pressure vessel to hold the ring chuck, an interior of the reduced pressure vessel being divided into upper and lower portions by the ring chuck, the support member and the substrate, an inner wall provided to connect a roof plate of the vessel and the support member to each other and to further divide the upper portion into a deposition chamber and an exhaust chamber, a transfer chamber provided in the lower portion for substrate transfer, both of the deposition chamber and the exhaust chamber being formed in axial symmetry around the same central axis and communicated to each other by holes provided in the inner wall, and the deposition chamber and the transfer chamber being communicated to each other by a gap formed between the ring chuck and the support member.

In this manner, the interior of the reduced pressure vessel is divided into upper and lower portions, and the deposition chamber and the exhaust chamber are provided at the same horizontal level in the upper portion to be disposed in axial symmetry around the same central axis, whereby gas flows without stagnation can be formed within the deposition chamber and the exhaust chamber. As a result, a raw material gas and a secondary product gas are inhibited from spreading toward the transfer chamber provided in the lower portion, and deposition and adhesion of them on the back surface of the substrate can be suppressed.

Also, a CVD apparatus of the invention is characterized by a support member provided on side walls of the reduced pressure vessel to hold the ring chuck, an interior of the reduced pressure vessel being divided into upper and lower portions by the ring chuck, the support member and the substrate, an inner wall suspended from a roof plate of the vessel toward the ring chuck with a predetermined gap therebetween to further divide the upper portion into a deposition chamber and an exhaust chamber, a transfer chamber provided in the lower portion for substrate transfer, both of the deposition chamber and the exhaust chamber being formed in axial symmetry around the same central axis and communicated to each other by a gap between the inner wall and the ring chuck and/or holes provided in the inner wall, and the deposition chamber and the transfer chamber being communicated to each other by a gap formed between the ring chuck and the support member.

With such arrangement, the purge gas flows directly into the exhaust chamber from the transfer chamber but does not flow into the deposition chamber, so that the flow in the deposition chamber can be made less stagnation to further reduce the amount of a raw material gas and the like entering into the transfer chamber.

Further, a CVD apparatus of the invention for forming a thin film including at least one of constituent elements of a raw material gas on a substrate by placing the substrate on a heating holder provided in a reduced pressure vessel, fixing the substrate by means of a ring chuck having the function of preventing the raw material gas and a secondary product gas from spreading to the back surface of the substrate, and introducing the raw material gas from a gas introducing section provided to be opposed to the substrate, is characterized in that the ring chuck is provided at a lower portion of the inner circumference edge thereof with a tapered portion to hold and fix the substrate on the heating holder, and an outlet for a purge gas is provided on the tapered portion to permit the purge gas to be emitted to an outer circumference portion of the substrate from the outlet.

In this manner, the outer circumference portion of the substrate is held and fixed by the tapered portion of the ring chuck whereby it is possible to surely prevent a raw and a secondary product gas from spreading to the back surface of the substrate. Also, because of line contact between the ring chuck and the substrate, heat conduction from the substrate is suppressed to inhibit the deposition on the ring chuck as well as a contact portion thereof with the substrate. Further, even in the case where the diffusion in very small amount is not allowable as with Cu, it is possible to surely shut off spreading of a raw material gas and a secondary product gas to the back surface by introducing the purge gas to the outer circumference portion of the substrate from the purge gas outlet provided on the tapered portion.

Besides, since a thin film can be formed over substantially the entire surface of the substrate while the spreading of a raw material gas to the back surface is surely shut off, it is possible to enhance the yield of semiconductor chips.

PREFERRED EMBODIMENTS OF THE INVENTION

Embodiments of the invention will be described with reference to the drawings.

Figure 1:
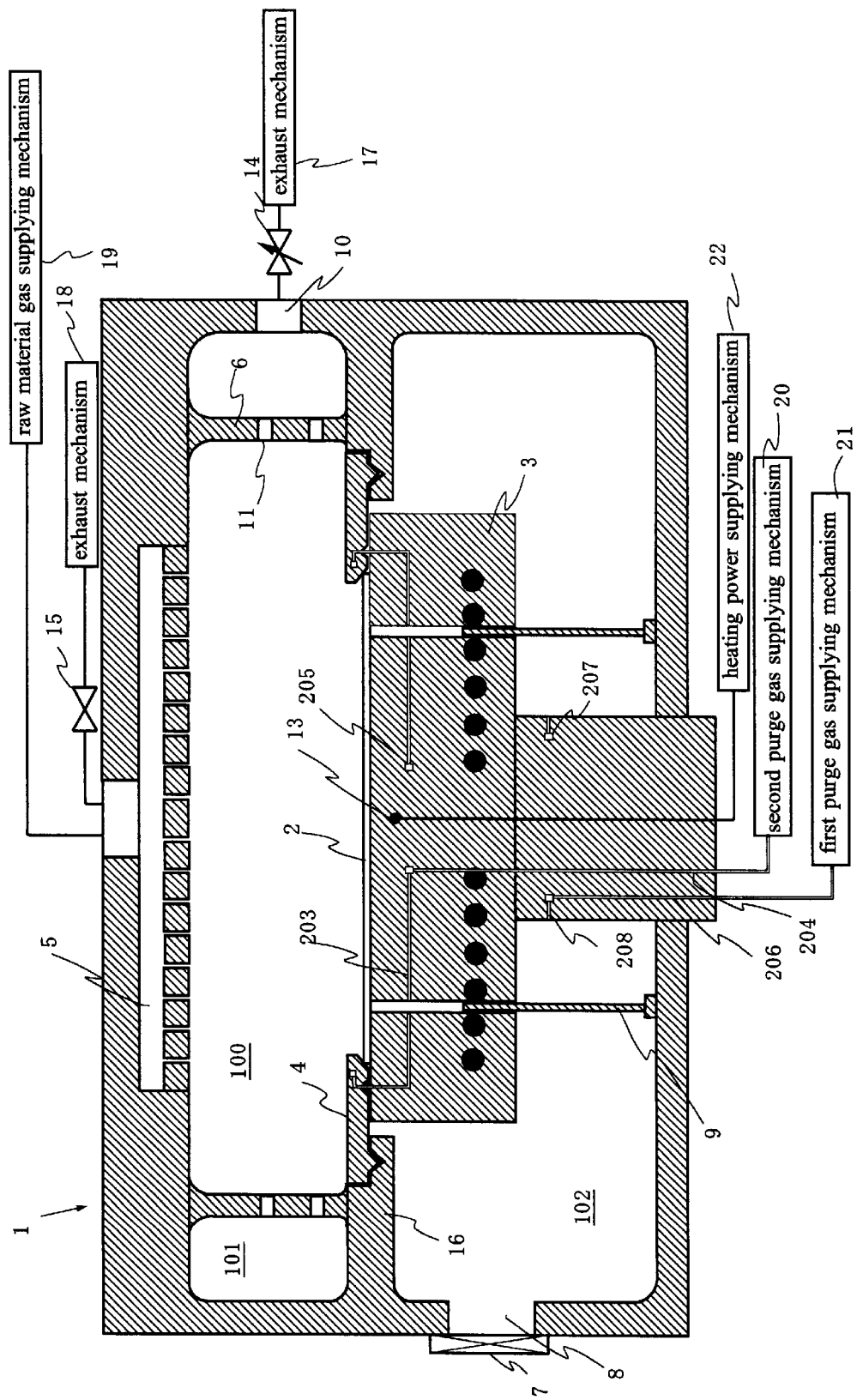
FIG. 1 is a schematic cross sectional view showing a constructional example of a CVD apparatus of the invention.

An exemplary construction of a CVD apparatus according to a first embodiment of the invention is shown in a schematic cross sectional view of FIG. 1. FIG. 1 shows an interior of a reduced pressure vessel at the time of deposition. As shown in the figure, the interior of the reduced pressure vessel 1 is divided into three chambers, that is, a deposition chamber 100, an exhaust chamber 101 and a transfer chamber 102, the deposition chamber and the exhaust chamber being arranged above the transfer chamber to be disposed in axial symmetry around the same central axis.

A substrate 2 is placed on a vertically movable heating holder 3, and a tapered edge formed on the inner circumference end of a doughnut-shaped ring chuck 4 contacts entirely circumferentially with the edge of the substrate 2 to fix the same. A gas introducing section 5 is provided in a position opposed to the substrate to be connected to a raw material gas supplying mechanism 19 outside to introduce into the deposition chamber 100 a raw material gas required for deposition. The gas introducing section is provided with a multiplicity of gas blow-off holes at a predetermined interval to permit the raw material gas to be uniformly blown off. The deposition chamber 100 and the exhaust chamber 101 are partitioned by an inner wall 6 connected to a support member 16, which bears and supports the ring chuck upon lowering of the heating holder 3, and to a roof plate of the vessel, and the both chambers are joined spatially to each other by holes 11 formed on the inner wall 6. Also, the exhaust chamber 101 is connected to an outside exhaust mechanism 17 via an exhaust port 10 and a valve 14, and an unreacted part of the raw material gas introduced into the deposition chamber and a secondary product gas are exhausted outside through the holes 11 and the exhaust port 10.

Meanwhile, provided in the transfer chamber 102 disposed in a lower portion of the vessel are pins 9, which temporarily support the substrate during the exchange of a substrate, a transfer port 8 for carrying-in and out of a substrate, and a slit valve 7, in addition to the heating holder 3. In addition, a gap 50 of predetermined spacing is formed between the support member 16 and the ring chuck 4.

First, the procedure of placing a substrate on the heating holder and subsequently performing the deposition on the substrate will be described with reference to FIG. 1.

When a vertically driving mechanism (not shown) is used to lower the heating holder 3 to a lowermost end, the pins 9 come to protrude above the heating holder. Subsequently, the slit valve 7 is opened to permit a robot arm (not shown) holding a non-processed substrate to be inserted into the transfer chamber 102 to place the substrate on the pins 9.

Then, the driving mechanism is used to raise the heating holder. The substrate comes into contact with the ring chuck 4 and rises to stop in a predetermined position. A preferable distance between the ring chuck 4 and the support member 16 is about 0.3 to 1.0 mm.

The substrate 2 is heated to a desired temperature due to thermal conduction from a heater 12 provided in the heating holder 3.

In addition, the temperature of the heating holder is controlled by a heating power supplying mechanism 22 connected to a thermocouple 13 and the heater 12, and the substrate is heated uniformly over the surface thereof by a configuration of the heater 12. Meanwhile, a raw material gas together with a carrier gas is introduced into the deposition chamber 100 from the gas introducing section 5 to form a desired thin film on the substrate. Meanwhile, an unreacted raw material gas and a secondary product gas flow into the exhaust chamber 101 through the holes 11 and are exhausted outside the vessel through the exhaust port 10.

As described above, if a metal such as copper adheres to the back surface of a substrate, it diffuses into a semiconductor substrate to cause deterioration of an integrated circuit performance. Accordingly, in order to stably produce semiconductor integrated circuits of a desired performance, it is very important to shield the back surface of a substrate or the like from a raw material gas and keep the same in a clean state at the time of metallic thin film formation.

Hereinbelow, a prevention mechanism of contamination on the back surface of a substrate will be described in detail with respect to the CVD apparatus shown in FIG. 1.

The cause for contamination on the back surface of a substrate includes the direct contamination due to the spreading of a raw material gas and a secondary product gas (referred below to as "raw material gas and the like") to the back surface of a substrate and the indirect contamination due to a raw material gas adhered to the heating holder and a transfer mechanism and a film formed on surfaces thereof. They may be believed to be caused by a raw material gas and the like spreading to the transfer chamber side.

In this respect, a first contamination preventing mechanism resides in partitioning of an internal structure of the reduced pressure vessel 1 into the deposition chamber 100, the exhaust chamber 101 and the transfer chamber 102. Thereby, the transfer chamber is not on a path of gas flow, and therefor the path permitting a raw material gas and the like to flow into the back surface of a substrate 2, the heating holder and the transfer mechanism is essentially eliminated, so that it is possible to prevent contamination on the back surface of a substrate. Further, the deposition chamber 100 and the exhaust chamber 101 are arranged above the transfer chamber 102 to be disposed at the same horizontal level and in axial symmetry around the same central axis, whereby the resulting gas flow is made in axial symmetry and is not accompanied by stagnation. As a result, gas exhaust is efficiently performed and the clean atmosphere in the vessel is rapidly formed, so that it is possible to effectively prevent the contamination on the back surface of a substrate. Further, it is preferable to make corners of the deposition chamber 100, the exhaust chamber 101 and the transfer chamber 102 smooth curved surfaces, which can form a gas flow without stagnation. Also, several exhaust ports 10 may be provided in axial symmetry around the central axis to enable forming a more uniform flow of axial symmetry.

With the CVD apparatus shown in FIG. 1, if a raw material gas and the like spread to the transfer chamber during deposition, its path therefor would be defined by the contact portion between the ring chuck 4 and the substrate 2 or gaps between an outer edge portion of the ring chuck and the support member 16. Also, if a film is deposited to the contact portions between the ring chuck and the substrate, peeling-off of the film would be caused during the engagement and disengagement of the ring chuck to generate particles. Accordingly, as a second contamination preventing mechanism, there are provided a mechanism for preventing dispersion of a raw material gas and the like through minute gaps on the contact portions between the ring chuck and the substrate, and a mechanism for preventing film deposition on the contact portions. As a third contamination preventing mechanism, there is provided a mechanism for preventing spreading a raw material gas and the like through a gap 50 between the outer edge portion of the ring chuck and the vessel wall. Such substrate back surface contamination preventing mechanisms will be described below.

Figure 2:
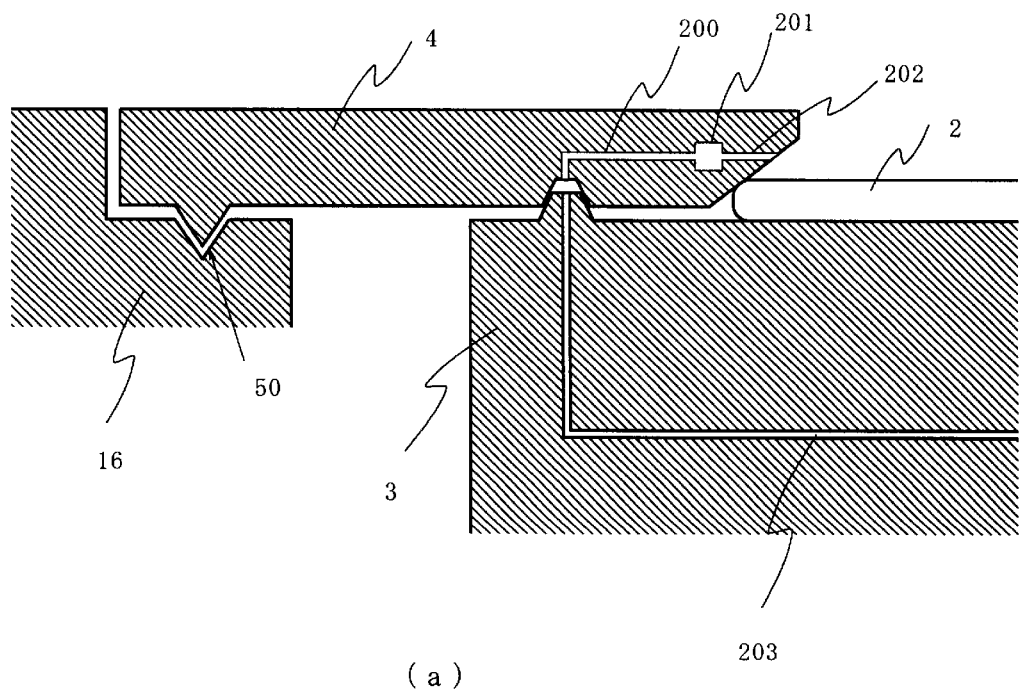
FIG. 2 is an enlarged, schematic cross sectional view showing surroundings of an inner peripheral portion of a ring chuck.
Figure 2:
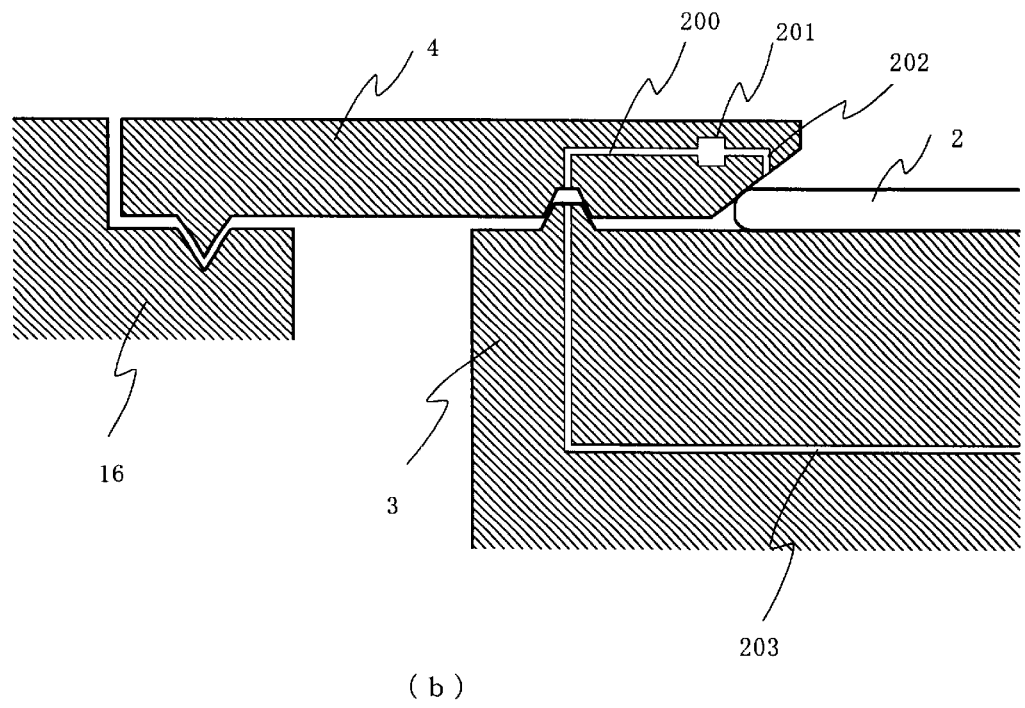

First, the second contamination preventing mechanism will be described with reference to FIG. 2.

FIG. 2(a) is a schematic cross sectional view showing details of the ring chuck contacting with an end portion of a substrate. A tapered portion of a tip end of the ring chuck contacts with the end of the substrate over the entire circumference thereof, such contact shutting off a path, along which a raw material gas spreads to the back surface of a substrate. However, since the contact portion between the both is exposed to the raw material gas, film deposition is possibly caused on the outer circumference of the substrate and the ring chuck. In order to prevent such film deposition, contrivance is made to enable blowing of a purge gas (second purge gas) toward the inner circumference side of the contact portion.

The second purge gas supplied from the heating holder 3 is fed to a ring-shaped supply passage 201 in the ring chuck via a plurality of radially extending supply passages 200 provided within the ring chuck and further to a gap 202 connected to the supply passage 201, and is blown off toward the end of the substrate from the outlet of the gap. The gap 202 may be either one formed continuously along the circumference of the ring chuck or discrete ones partitioned at a constant spacing. Here, the purge gas can be uniformly blown off along the inner circumference of the ring chuck by making conductance of the gap 202 small as compared with the supply passage 201.

Since the ring chuck 4 and the heating holder 3 cannot contact with each other, contrivance is made such that the outlet portions of supply passages 203 in the heating holder 3 and inlet portions of the supply passages 200 are formed in a concave-convex relationship as shown in the figure to enable the second purge gas to be supplied to the ring chuck 4 from the heating holder 3 without leakage to a space except the supply passages as much as possible. The second purge gas is supplied to a supply passage 204 in the heating holder 3 from a second purge gas supplying mechanism 20 provided outside. A ring-shaped distribution passage 205 branches the supply passage 204 into a plurality of radially extending supply passages 203 in an upper portion of the heating holder, so that the purge gas is distributed evenly in a circumferential direction to be fed to the supply passages 200. Here, the number of the radially extending supply passages 203 is preferably 8 to 24. The purge gas can prevent the deposition on the contact portion between the substrate and the ring chuck and the invasion of a raw material gas and the like tending to pass dispersedly through the minute gaps on the contact portion.

Also, the purge gas outlet of the ring chuck may be made perpendicular to the substrate surface as shown in FIG. 2(b) to thereby obtain a higher adhesion preventive effect. A region of deposition on the outer circumference portion of the substrate can be controlled depending upon a flow rate of the purge gas, and the deposition can be made over substantially the entire surface of the substrate since the ring chuck contacts the substrate at its end. Also, the deposition can be made in a wide range of pressure since the substrate is secured by the ring chuck.

Subsequently, the third contamination preventing mechanism will be described with reference to FIGS. 1 and 2.

A purge gas (first purge gas) is supplied to a purge gas supply passage 206 in the heating holder from a first purge gas supplying mechanism 21 provided outside to be blown off into the transfer chamber 102 from below the heating holder 3. A ring-shaped distribution passage 207 branches the supply passage 206 into a plurality of radially extending supply passages 208, so that the first purge gas is distributed evenly in a circumferential direction to be fed to the transfer chamber. The effect produced thereby is that the flow without stagnation can be produced by making the purge gas flow symmetrically in the transfer chamber and flow uniformly through the gap 50. Here, the number of the radially extending supply passages 208 is preferably 8 to 24.

Supplying of the first purge gas makes pressure in the transfer chamber 102 higher than that in the deposition chamber 100 during deposition, and so the purge gas flows into the deposition chamber through the gap 50 between the outer edge portion of the ring chuck 4 and the support member 16. Since the purge gas flows into the deposition chamber as a viscous flow when a pressure difference between the transfer chamber and the deposition chamber is hundreds in Pa, the spreading of a raw material gas from the deposition chamber can be effectively suppressed.

The flow from the gap is made more uniform in the circumferential direction by increasing the pressure difference the transfer chamber and the deposition chamber.

Further, the prevention effect for the raw material gas spreading can be further enhanced by making a configuration of the gap 50 between the ring chuck 4 and the support member 16 complex, for example, a combination of concave and convex wedges or the like. Also, the ring chuck and the support member are constructed concavely and convexly to afford engagement with each other, thereby presenting an additional effect that positioning of the ring chuck is carried out by the contact with the ring chuck and the vessel wall at every exchange of a substrate.

In addition, raising of pressure in the transfer chamber to a certain degree enables the first purge gas to flow into the deposition chamber not only through the gap 50 but also partly through the supply passages 200 in the ring chuck 4. In this way, it may be possible in some cases to omit the second purge gas.

In the present invention, since the pressure in the transfer chamber is normally higher by 10% than that in the deposition chamber, the pressure difference between the both chambers may cause the ring chuck to chatter or move during deposition in some cases when such pressure difference becomes large. Movement of the ring chuck or the like will cause problems that the gas flow is made turbulent and the raw material gas flows to the transfer chamber. Moreover, the ring chuck rubs on the substrate and the support member to cause the generation of particles and the damage on the substrate.

Accordingly, it is preferable that the ring chuck is made sufficiently heavy to withstand such pressure difference and not to move. For example, in the case of a substrate having a diameter of 200 mm, a ring chuck having a weight of around 5 kg or more and a diameter of 300 mm is suitably used.

Figure 4:
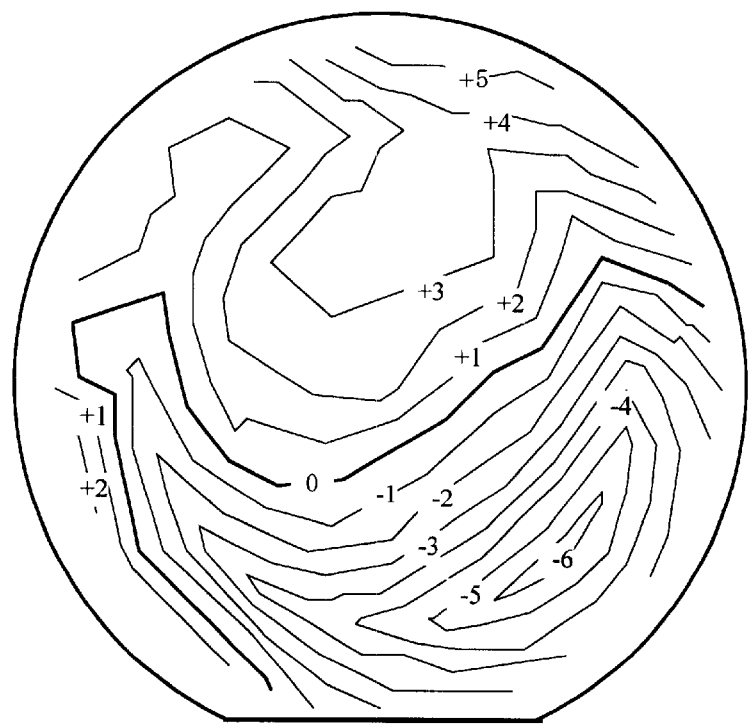
FIG. 4 is a contour map showing a distribution of the sheet resistance.
Figure 4:
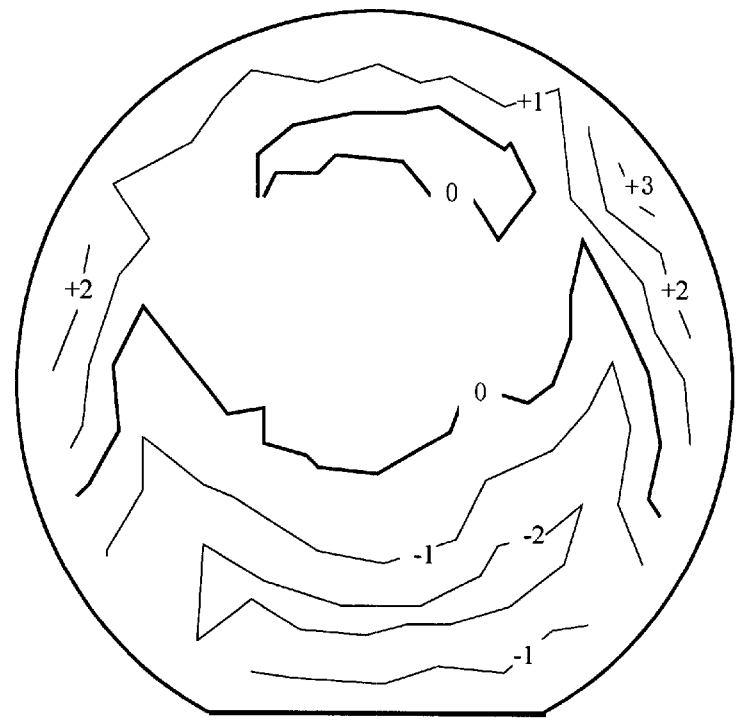
Figure 5:
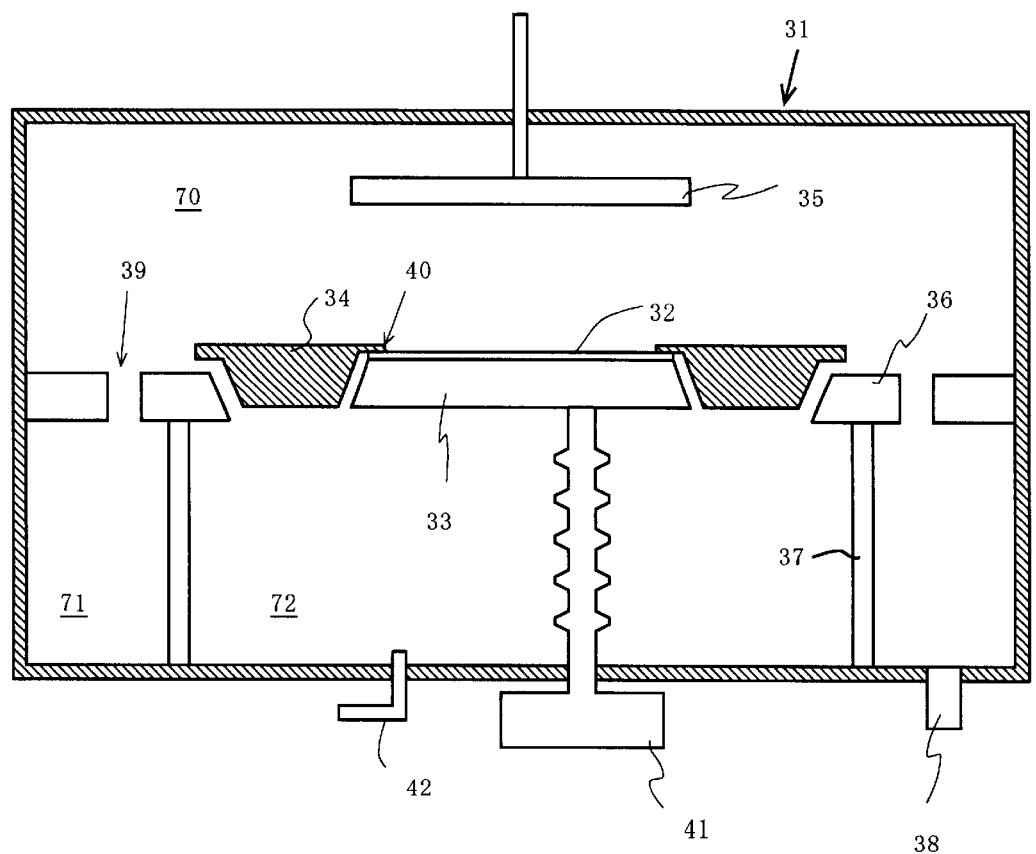
FIG. 5 is a schematic cross sectional view showing a conventional gas spreading preventing mechanism.
Figure 6:
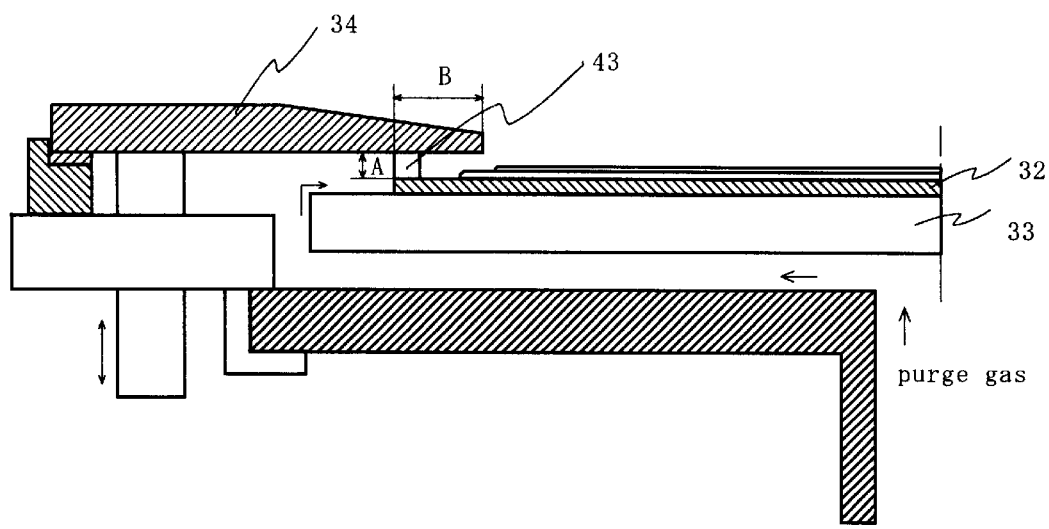
FIG. 6 is a schematic cross sectional view showing a conventional gas spreading preventing mechanism.
Figure 7:
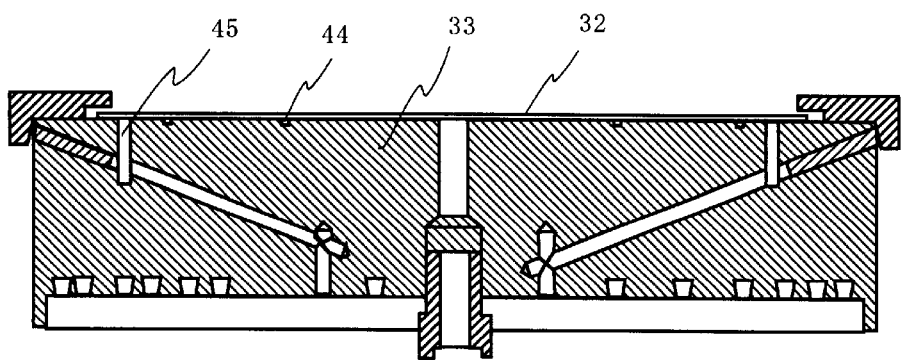
FIG. 7 is a schematic cross sectional view showing a conventional gas spreading preventing mechanism.

Also, the ring chuck is preferably designed to apply load on a substrate uniformly. That is, when forces serving to hold down a substrate become ununiform, which may cause the temperature difference in the substrate, the film thickness uniformity is in some cases degraded depending upon kinds of a substrate and a thin film formed and conditions of deposition. One example is shown in FIG. 4.

FIG. 4(a) shows a distribution of the sheet resistance when a Cu thin film is formed by attaching a horseshoe-type weight to a bottom surface of a ring chuck to make the whole assembly 5 kg in weight. On the other hand, FIG. 4(b) shows a distribution of the sheet resistance when a Cu thin film is formed in the same manner by using a thick ring chuck (5 kg). In the figure, contour lines are indicated at a spacing of 1% and thick lines are contour lines for average values.

As apparent from the drawings, it is found that a film thickness distribution [(maximum value−minimum value)/ (maximum value+minimum value)] is ±7.3% in the case where the ring chuck with the horseshoe-type weight is used, while a film thickness distribution in the case of using the uniformly loaded ring chuck is ±3.3% to be greatly improved.

Further, the cause for contamination on the back surface of a substrate except during deposition is found. That is, the raw material gas adsorbing and remaining on inner walls of the gas introducing section 5 is released to enter into the deposition chamber during the exchange of a substrate after deposition, thus causing the contamination on the back surface of a substrate and the surface of the heating holder. Hereupon, the measures (fourth contamination preventing mechanism) for preventing contamination on the back surface of a substrate, due to a raw material gas remaining in the gas introducing section will be described below.

Supplying of the first and second purge gases continues for a short while even after the introduction of a raw material gas and a carrier gas into the deposition chamber 100 is stopped and the deposition on a substrate is terminated. After the lapse of a predetermined period, a switch valve 15 is opened to exhaust the interior of the gas introducing section 5 by means of an outside exhaust mechanism 18 separate from the exhaust mechanism 17 connected to the exhaust chamber 101. At this time, a part of the purge gas flowing into the deposition chamber is exhausted through the interior of the gas introducing section 5, and so the interior of the gas introducing section is purged by the purge gas whereby the raw material gas remaining in the gas introducing section is rapidly exhausted outside. In the meantime, purging is also effected in the deposition chamber and the exhaust chamber by the purge gas.

After purging for a predetermined period, supplying of the second purge gas is stopped for the exchange of a substrate. The reason why supplying of the second purge gas is stopped is that there is the possibility of a substrate to be offset from a predetermined position at the time of exchange of a substrate, due to flowing of the second purge gas in the vicinity of a substrate. Meanwhile, the first purge gas continues to be supplied in that flow rate, which does not interfere with exchange and conveyance of a substrate. In this state, the first purge gas remains to flow into the deposition chamber and the gas introducing section from the transfer chamber, so that it is possible to suppress invasion of the raw material gas of slight amount remaining in the gas introducing section after purging. Accordingly, the above-mentioned fourth contamination preventing mechanism can prevent that contamination on the back surface of a substrate and on the transfer mechanism including the heating holder, which is caused by adhesion of the raw material gas, even at the time of substrate exchange.

The deposition conditions suited in the case of forming a Cu thin film on a substrate having a diameter of 200 to 300 mm with the use of the CVD apparatus shown in FIG. 1 are as follows: The temperature of the heating holder is 170 to 200° C., the deposition pressure being 0.1 to 1 kPa, the flow rate of Cu (hfac) (tmvs), which is a raw material gas, being 0.1 to 1 g/min, the flow rate of $H_2$ as a carrier gas being 50 to 200 sccm, the flow rate of Ar being 50 to 200 sccm, the flow rate of $N_2$ being 50 to 200 sccm, the flow rate of the second purge gas supplied to the ring chuck being 10 to 100 sccm, and the flow rate of the first purge gas being 10 to 500 sccm. The flow rate of the first purge gas during substrate exchange is 5 to 100 sccm. Here, an inert gas such as Ar, $N_2$ or the like is used as the purge gas.

The deposition on a substrate having a diameter of 200 mm under the above-mentioned conditions has revealed that the deposition could be made on substantially the entire surface and that it was found as a result of atomic absorption analysis to suppress the amount of contamination on the back surface of a substrate to an exceedingly low value, for example, $1 \times 10^{11}$ atoms/cm$^2$ or less for Cu atoms.

Subsequently, a second embodiment of the invention will be described.

Figure 3:
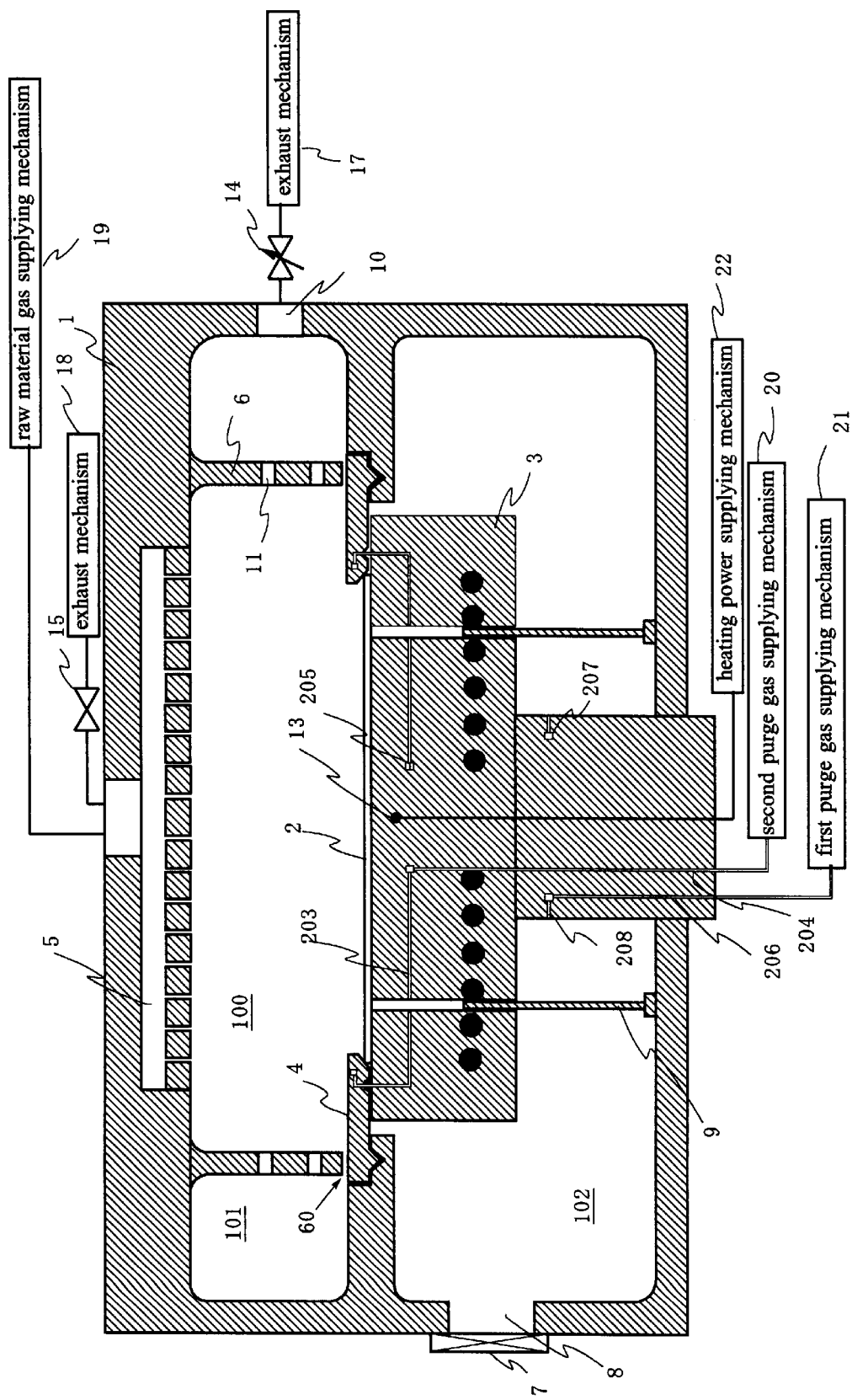
FIG. 3 is a schematic cross sectional view showing another constructional example of a CVD apparatus of the invention.

FIG. 3 is a schematic cross sectional view showing another exemplary construction of a CVD apparatus of the invention. A primary difference between the CVD apparatus of the present embodiment and the CVD apparatus shown in FIG. 1 resides in that an inner wall 6 separating the deposition chamber 100 and the exhaust chamber 101 from each other is mounted in a different position. More specifically, with the CVD apparatus shown in FIG. 3, the inner wall is suspended above the ring chuck 4 from the roof plate of the vessel to leave a predetermined gap 60 between the ring chuck and the inner wall. The deposition chamber 100 and the exhaust chamber 101 are spatially joined to each other by way of the holes 11 provided in the inner wall 6 and the gap 60 between the inner wall 6 and the ring chuck, and the transfer chamber 102 and the exhaust chamber 101 are spatially joined to each other by way of the gap 50 between the ring chuck 4 and the vessel wall.

Preferably, the gap 60 between the inner wall 6 and the ring chuck 4 has a distance of 0.5 to 5.0 mm at the time of deposition, which distance is adjusted by a height of the inner wall. Like the holes 11, the gap 60 serves as a part of a flow path for a raw material gas flowing to the exhaust chamber 101 from the deposition chamber 100. Here, the flow in the deposition chamber is axially symmetric in the same manner as in the first embodiment.

Also, the second embodiment is greatly different from the first embodiment in that the purge gas flows directly into the exhaust chamber from the transfer chamber. The resulting effect is that the purge gas blown off from the gap 50 between the ring chuck 4 and the support member 16 does not flow into the deposition chamber and so the flow in the deposition chamber is simple and free from circulation to thereby make residence time of the raw material gas and the like in the deposition chamber short. Also, since the pressure in the exhaust chamber is relatively lower than that in the deposition chamber, the amount of the raw material gas and the like entering into the transfer chamber through the gap 50 can be further reduced as compared with that in the first embodiment.

The second embodiment is the same as the first embodiment in other construction and function, and the both are the same in mechanism and action for the above-mentioned prevention of contamination on the back surface of a substrate.

Also, suitable conditions of deposition with the apparatus of FIG. 3 are substantially the same as those with the apparatus of FIG. 1. As a result of the apparatus of FIG. 3 being used to carry out the same deposition experiment as in the first embodiment, it has been confirmed that the prevention effect of contamination on the back surface of a substrate is obtained to be identical to or higher than that in the first embodiment.

As has been described above, the CVD apparatuses shown in FIGS. 1 and 2 are both provided with the first to fourth contamination preventing mechanisms to enable suppressing the amount of contamination on the back surface to a very slight contamination level equal to or lower than that level where the operating characteristic of high performance semiconductor integrated circuits can be conducted, even in the case of formation of a Cu thin film on a semiconductor substrate, thus greatly contributing to stable production of next-generation integrated circuits, for which high performance and high integration are to be achieved. In addition, the CVD apparatus according to the present invention is not limited to the above-mentioned embodiments. For example, all of the first to fourth contamination preventing mechanisms are not necessarily provided and the apparatus suffices to be designed conformed to a required amount of contamination on the back surface of a substrate.

In addition, the CVD apparatus according to the invention is used preferably for the formation of a Cu thin film, but is not limited thereto, and can be applied to the formation of various thin films such as tungsten thin film, semiconductor thin films and the like.

As apparent from the above, it is possible in a CVD apparatus for formation of a thin film on a substrate, according to the invention, to make deposition on a substantially entire surface of a substrate and to provide a CVD apparatus, which can suppress the contamination on the back surface of a substrate due to a raw material gas and a secondary product gas, to an exceedingly low level and is high in productivity and yield.

What is claimed is:

1. A CVD apparatus for forming a thin film on a substrate, the apparatus comprising:
   a heating holder for the substrate provided in a reduced pressure vessel,
   a ring chuck for fixing the substrate and having the function of preventing a raw material gas and a secondary product gas from spreading to the back surface of the substrate,
   a gas introducing section provided opposed to the substrate for introducing the raw material gas,
   a support member provided on side walls of the reduced pressure vessel to hold the ring chuck, an interior of the reduced pressure vessel being divided into upper and lower portions by the ring chuck, the support member and the substrate, an inner wall provided to connect a roof plate of the vessel and the support member to each other and to further divide the upper portion into a deposition chamber and an exhaust chamber, a transfer chamber provided in the lower portion for substrate transfer, both of the deposition chamber and the exhaust chamber being formed in axial symmetry around the same central axis and communicated to each other by holes provided in the inner wall, and the deposition chamber and the transfer chamber being communicated to each other by a gap formed between the ring chuck and the support member,
   a first purge gas introducing section provided in the transfer chamber so that the first purge gas is made to flow into the deposition chamber from the transfer chamber, and
   a plurality of supply passages for the first purge gas provided inside the heating holder so that the first purge gas is blown off into the transfer chamber in an axially symmetrical manner, wherein the ring chuck fixes the substrate to a surface of the heating holder.

2. The CVD apparatus according to claim 1, wherein the first purge gas is made to flow into the deposition chamber from the transfer chamber through the gap formed between the ring chuck and the support member.

3. The CVD apparatus according to claim 1, further comprising concave and convex portions, which are provided on facing portions of the ring chuck and the support member to engage at least partially with each other.

4. The CVD apparatus according to claim 1, wherein the ring chuck is provided at a lower portion of the inner circumference edge thereof with a tapered portion to hold and fix the substrate, and an outlet for a second purge gas is provided on the tapered portion to permit the second purge gas to be emitted to the outer circumference portion of the substrate from the outlet for the second purge gas.

5. The CVD apparatus according to claim 4, wherein the outlet for the second purge gas is formed along the inner circumference portion of the ring chuck.

6. The CVD apparatus according to claim 4, wherein the outlet for the second purge gas is disposed on the central axis side to the contact portion with the substrate.

7. The CVD apparatus according to claim 4, wherein the outlet for the second purge gas is designed to permit the purge gas to be emitted substantially perpendicular to the surface of the substrate.

8. The CVD apparatus according to claim 1, wherein the ring chuck is not moved by a pressure difference between the transfer chamber and the deposition chamber or between the transfer chamber and the exhaust chamber.

9. The CVD apparatus according to claim 8, wherein the ring chuck is designed to evenly load the substrate.

10. The CVD apparatus according to claim 1, wherein the thin film is a Cu thin film.

11. The CVD apparatus according to claim 1, wherein the ring chuck is adapted to contact an entire circumference of the substrate.

12. A CVD apparatus for forming a thin film on a substrate, the apparatus comprising:
- a heating holder for the substrate provided in a reduced pressure vessel,
- a ring chuck for fixing the substrate and having the function of preventing a raw material gas and a secondary product gas from spreading to the back surface of the substrate for introducing the raw material gas,
- a gas introducing section provided opposed to the substrate,
- a support member provided on side walls of the reduced pressure vessel to hold the ring chuck, an interior of the reduced pressure vessel being divided into upper and lower portions by the ring chuck, the support member and the substrate, an inner wall suspended from a roof plate of the vessel toward the ring chuck with a predetermined gap there between to further divide the upper portion into a deposition chamber and an exhaust chamber, a transfer chamber provided in the lower portion for substrate transfer, both of the deposition chamber and the exhaust chamber being formed in axial symmetry around the same central axis and communicated to each other by a gap between the inner wall and the ring chuck and/or holes provided in the inner wall, and the deposition chamber and the transfer chamber being communicated to each other by a gap formed between the ring chuck and the support member,
- a first purge gas introducing section provided in the transfer chamber so that the first purge gas is made flow into the exhaust chamber from the transfer chamber, and
- a plurality of supply passages for the first purge gas provided inside the heating holder so that the first purge gas is blown off into the transfer chamber in an axially symmetrical manner wherein the ring chuck fixes the substrate to a surface of the heating holder.

13. The CVD apparatus according to claim 12, wherein the first purge gas is made flow into the exhaust chamber from the transfer chamber through the gap formed between the ring chuck and the support member.

14. The CVD apparatus according to claim 12, further comprising concave and convex portions, which are provided on facing portions of the ring chuck and the support member to engage at least partially with each other.

15. The CVD apparatus according to claim 12, wherein the ring chuck is provided at a lower portion of the inner circumference edge thereof with a tapered portion to hold and fix the substrate, and an outlet for a second purge gas is provided on the tapered portion to permit the second purge gas to be emitted to the outer circumference portion of the substrate from the outlet for the second purge gas.

16. The CVD apparatus according to claim 15, wherein the outlets for the second purge gas are formed along the inner circumference portion of the ring chuck.

17. The CVD apparatus according to claim 15, wherein the outlet for the second purge gas is disposed on the central axis side to the contact portion with the substrate.

18. The CVD apparatus according to claim 15, wherein the outlet for the second purge gas is designed to permit the purge gas to be emitted substantially perpendicular to the surface of the substrate.

19. The CVD apparatus according to claim 12, wherein the ring chuck is not moved by a pressure difference between the transfer chamber and the deposition chamber or between the transfer chamber and the exhaust chamber.

20. The CVD apparatus according to claim 19, wherein the ring chuck is designed to evenly load the substrate.

21. The CVD apparatus according to claim 12, wherein the thin film is a Cu thin film.

22. The CVD apparatus according to claim 12, wherein the ring chuck is adapted to contact an entire circumference of the substrate.

23. A CVD apparatus for forming a thin film on a substrate, the apparatus comprising:
- a heating holder for the substrate provided in a reduced pressure vessel,
- a ring chuck for fixing the substrate and having the function of preventing a raw material gas and a secondary product gas from spreading to a back surface of the substrate,
- a gas introducing section provided opposed to the substrate for introducing the raw material gas,
- the ring chuck is provided at a lower portion of the inner circumference edge thereof with a tapered portion to hold and fix the substrate on the heating holder, and an outlet for a purge gas is provided on the tapered portion to permit the purge gas to be emitted to an outer circumference portion of the substrate from the outlet, wherein the ring chuck fixes the substrate to a surface of the heating holder.

24. The CVD apparatus according to claim 23, wherein the outlet for the purge gas is formed along the inner circumference portion of the ring chuck.

25. The CVD apparatus according to claim 23, wherein the outlet for the purge gas is disposed on the central axis side to the contact portion with the substrate.

26. The CVD apparatus according to any one of claims 23, wherein the outlet for the purge gas is designed to permit the purge gas to be emitted substantially perpendicular to the surface of the substrate.

27. The CVD apparatus according to claim 23, wherein the thin film is a Cu thin film.

28. The CVD apparatus according to claim 23, wherein the ring chuck is adapted to contact an entire circumference of the substrate.

29. The CVD apparatus of claim 23, wherein the outlet includes a passageway formed in the tapered portion of the ring chuck.

30. The CVD apparatus according to claim 23, further characterized by a support member provided on side walls of the reduced pressure vessel to hold the ring chuck, an interior of the reduced pressure vessel being divided into upper and lower portions by the ring chuck, the support member and the substrate, an inner wall provided to connect a roof plate of the vessel and the support member to each other and to further divide the upper portion into a deposition chamber and an exhaust chamber, a transfer chamber provided in the lower portion for substrate transfer, both of the deposition chamber and the exhaust chamber being formed in axial symmetry around the same central axis and communicated to each other by holes provided in the inner wall, and the deposition chamber and the transfer chamber being communicated to each other by a gap formed between the ring chuck and the support member.

31. The CVD apparatus according to claim 23, further characterized by a support member provided on side walls of the reduced pressure vessel to hold the ring chuck, an interior of the reduced pressure vessel being divided into upper and lower portions by the ring chuck, the support member and the substrate, an inner wall suspended from a roof plate of the vessel toward the ring chuck with a predetermined gap therebetween to further divide the upper portion into a deposition chamber and an exhaust chamber, a transfer chamber provided in the lower portion for substrate transfer, both of the deposition chamber and the exhaust chamber being formed in axial symmetry around the same central axis and communicated to each other by a gap between the inner wall and the ring chuck and/or holes provided in the inner wall, and the deposition chamber and the transfer chamber being communicated to each other by a gap formed between the ring chuck and the support member.

32. A CVD apparatus for forming a thin film on a substrate, the apparatus comprising:

a heating holder for the substrate provided in a reduced pressure vessel, a ring chuck for fixing the substrate and having the function of preventing a raw material gas and a secondary product gas from spreading to the back surface of the substrate, a gas introducing section provided opposed to the substrate for introducing the new material gas, a support member provided on side walls of the reduced pressure vessel to hold the ring chuck, an interior of the reduced pressure vessel being divided into upper and lower portions by the ring chuck, the support member and the substrate, an inner wall provided to connect a roof plate of the vessel and the support member to each other and to further divide the upper portion into a deposition chamber and an exhaust chamber, a transfer chamber provided in the lower portion for substrate transfer, both of the deposition chamber and the exhaust chamber being formed in axial symmetry around the same central axis and communicated to each other by holes provided in the inner wall, and the deposition chamber and the transfer chamber being communicated to each other by a gap formed between the ring chuck and the support member, wherein the ring chuck is provided at a lower portion of the inner circumference edge thereof with a tapered portion to hold and fix the substrate, and an outlet for a second purge gas is provided on the tapered portion to permit the second purge gas to be emitted to the outer circumference portion of the substrate from the outlet for the second purge gas, wherein the ring chuck is provided with a plurality of introduction ports for the second purge gas and a plurality of gas supply passages communicated to the introduction ports, the plurality of gas supply passages being connected to the outlet for the second purge gas through an annular supply passage.

33. The CVD apparatus according to claim 32, wherein the heating holder is provided with a plurality of gas supply passages for the second purge gas and a plurality of blow-off ports communicated to the gas supply passages, and the plurality of blow-off ports are formed in positions corresponding to the plurality of introduction ports of the ring chuck so that the second purge gas blown off from the second purge gas blow-off ports is fed to the introduction ports of the ring chuck.

34. The CVD apparatus according to claim 33, wherein the second purge gas blow-off ports of the heating holder and the second purge gas introduction ports of the ring chuck are in a concave and convex relationship so as to engage with each other.

35. A CVD apparatus for forming a thin film on a substrate, the apparatus comprising:

a heating holder for the substrate provided in a reduced pressure vessel, a ring chuck for fixing the substrate and having the function of preventing a raw material gas and a secondary product gas from spreading to the back surface of the substrate, a gas introducing section provided to be opposed to the substrate for introducing the raw material gas, a support member provided on side walls of the reduced pressure vessel to hold the ring chuck, an interior of the reduced pressure vessel being divided into upper and lower portions by the ring chuck, the support member and the substrate, an inner wall suspended from a roof plate of the vessel toward the ring chuck with a predetermined gap therebetween to further divide the upper portion into a deposition chamber and an exhaust chamber, a transfer chamber provided in the lower portion for substrate transfer, both of the deposition chamber and the exhaust chamber being formed in axial symmetry around the same central axis and communicated to each other by a gap between the inner wall and the ring chuck and/or holes provided in the inner wall, and the deposition chamber and the transfer chamber being communicated to each other by a gap formed between the ring chuck and the support member, wherein the ring chuck is provided at a lower portion of the inner circumference edge thereof with a tapered portion to hold and fix the substrate, and an outlet for a second purge gas is provided on the tapered portion to permit the second purge gas to be emitted to the outer circumference portion of the substrate from the outlet for the second purge gas, wherein the ring chuck is provided with a plurality of introduction ports for the second purge gas and a plurality of gas supply passages communicated to the introduction ports, the plurality of gas supply passages being connected to the outlet for the second purge gas through an annular supply passage.

36. A The CVD apparatus according to claim 35, wherein the ring chuck is adapted to contact an entire circumference of the substrate.

37. A CVD apparatus for forming a thin film on a substrate, the apparatus comprising:

a heating holder for the substrate provided in a reduced pressure vessel, a ring chuck for fixing the substrate and having the function of preventing a raw material gas and a secondary product gas from spreading to the back surface of the substrate, a gas introducing section provided opposed to the substrate for introducing the raw material gas, a support member provided on side walls of the reduced pressure vessel to hold the ring chuck, an interior of the reduced pressure vessel being divided into upper and lower portions by the ring chuck, the support member and the substrate, an inner wall provided to connect a roof plate of the vessel and the support member to each other and to further divide the upper portion into a deposition chamber and an exhaust chamber, a transfer chamber provided in the lower portion for substrate transfer, both of the deposition chamber and the exhaust chamber being formed in axial symmetry around the same central axis and communicated to each other by holes provided in the inner wall, and the deposition chamber and the transfer chamber being communicated to each other by a gap formed between the ring chuck and the support member, and a second exhaust mechanism for exhausting an interior of the gas introducing section, wherein the ring chuck fixes the substrate to a surface of the heating holder.

38. The CVD apparatus according to claim 37, wherein the heating holder is provided with a plurality of gas supply passages for the second purge gas and a plurality of blow-off ports communicated to the gas supply passages, and the plurality of blow-off ports are formed in positions corresponding to the plurality of introduction ports of the ring chuck so that the second purge gas blown off from the second purge gas blow-off ports is fed to the introduction ports of the ring chuck.

39. The CVD apparatus according to claim 38, wherein the second purge gas blow-off ports of the heating holder and the second purge gas introduction ports of the ring chuck are in a concave and convex relationship so as to engage with each other.

40. A CVD apparatus for forming a thin film on a substrate, the apparatus comprising:

a heating holder for the substrate provided in a reduced pressure vessel, a ring chuck for fixing the substrate and having the function of preventing a raw material gas and a secondary product gas from spreading to the back surface of the substrate, a gas introducing section provided to be opposed to the substrate for introducing the raw material gas, a support member provided on side walls of the reduced pressure vessel to hold the ring chuck, an interior of the reduced pressure vessel being divided into upper and lower portions by the ring chuck, the support member and the substrate, an inner wall suspended from a roof plate of the vessel toward the ring chuck with a predetermined gap therebetween to further divide the upper portion into a deposition chamber and an exhaust chamber, a transfer chamber provided in the lower portion for substrate transfer, both of the deposition chamber and the exhaust chamber being formed in axial symmetry around the same central axis and communicated to each other by a gap between the inner wall and the ring chuck and/or holes provided in the inner wall, and the deposition chamber and the transfer chamber being communicated to each other by a gap formed between the ring chuck and the support member, and a second exhaust mechanism for exhausting an interior of the gas introducing section.

41. A CVD apparatus for forming a thin film on a substrate, the apparatus comprising:

a heating holder for the substrate provided in a reduced pressure vessel, a ring chuck for fixing the substrate and having the function of preventing a raw material gas and a secondary product gas from spreading to a back surface of the substrate, a gas introducing section provided opposed to the substrate for introducing the raw material gas, the ring chuck is provided at a lower portion of the inner circumference edge thereof with a tapered portion to hold and fix the substrate on the heating holder, and an outlet for a purge gas is provided on the tapered portion to permit the purge gas to be emitted to an outer circumference portion of the substrate from the outlet, wherein the ring chuck is provided with a plurality of introduction ports for the purge gas and a plurality of gas supply passages communicated to the introduction ports, the plurality of gas supply passages being connected to the outlet for the second purge gas through an annular supply passage wherein the ring chuck fixes the substrate to a surface of the heating holder.

42. The CVD apparatus according to claim 41, wherein the heating holder is provided with a plurality of gas supply passages for the purge gas and a plurality of blow-off ports communicated to the gas supply passages, and the plurality of blow-off ports are formed in positions corresponding to the plurality of purge gas introduction ports on the ring chuck so that the purge gas blown off from the purge gas blow-off ports is fed to the purge gas introduction ports on the ring chuck.

43. The CVD apparatus according to claim 41, wherein the ring chuck is adapted to contact an entire circumference of the substrate.

44. The CVD apparatus of claim 41, wherein the outlet includes a passageway formed in the tapered portion of the ring chuck.

* * * * *